(12) United States Patent
Krasnov et al.

(10) Patent No.: US 8,809,674 B2
(45) Date of Patent: Aug. 19, 2014

(54) BACK ELECTRODE CONFIGURATION FOR ELECTROPLATED CIGS PHOTOVOLTAIC DEVICES AND METHODS OF MAKING SAME

(75) Inventors: Alexey Krasnov, Canton, MI (US); Willem Den Boer, Brighton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 13/455,317

(22) Filed: Apr. 25, 2012

(65) Prior Publication Data

US 2013/0284246 A1    Oct. 31, 2013

(51) Int. Cl.
H01L 31/18    (2006.01)

(52) U.S. Cl.
USPC ........... 136/255; 136/256; 136/262; 136/264; 136/265; 136/252

(58) Field of Classification Search
USPC .................. 136/255, 256, 262, 264, 265, 252
See application file for complete search history.

(56) References Cited

U.S. PATENT DOCUMENTS

| | | | |
|---|---|---|---|
| 4,335,266 A | 6/1982 | Mickelsen et al. | |
| 4,611,091 A | 9/1986 | Choudary et al. | |
| 4,915,745 A | 4/1990 | Pollock et al. | |
| 5,958,358 A | 9/1999 | Tenne et al. | |
| 6,077,722 A | 6/2000 | Jansen et al. | |
| 6,123,824 A | 9/2000 | Sano et al. | |
| 6,288,325 B1 | 9/2001 | Jansen et al. | |
| 6,784,361 B2 | 8/2004 | Carlson et al. | |
| 7,875,945 B2 | 1/2011 | Krasnov et al. | |
| 2004/0063320 A1 | 4/2004 | Hollars | |
| 2004/0144419 A1 | 7/2004 | Fix et al. | |
| 2004/0261841 A1 | 12/2004 | Negami et al. | |
| 2006/0180200 A1 | 8/2006 | Platzer Bjorkman et al. | |
| 2007/0093006 A1 | 4/2007 | Basol | |
| 2007/0193623 A1* | 8/2007 | Krasnov | 136/252 |
| 2009/0020157 A1* | 1/2009 | Krasnov et al. | 136/256 |
| 2009/0260678 A1 | 10/2009 | Di Stefano | |
| 2009/0272422 A1 | 11/2009 | Li | |
| 2010/0236629 A1 | 9/2010 | Chuang | |
| 2010/0253204 A1 | 10/2010 | Boehler et al. | |
| 2010/0297835 A1 | 11/2010 | Chuang et al. | |

(Continued)

FOREIGN PATENT DOCUMENTS

| | | |
|---|---|---|
| EP | 2 469 580 | 6/2012 |
| WO | WO 2012/033033 | 3/2012 |

OTHER PUBLICATIONS

U.S. Appl. No. 13/455,282, filed Apr. 25, 2012; Krasnov.
U.S. Appl. No. 13/455,232, filed Apr. 25, 2012; Krasnov et al.

(Continued)

*Primary Examiner* — Golam Mowla
(74) *Attorney, Agent, or Firm* — Nixon & Vanderhye P.C.

(57) ABSTRACT

A back contact configuration for a CIGS-type photovoltaic device is provided. The back contact configuration includes an interfacial seed layer, made up of one or more layers/sublayers, disposed between a Mo based rear contact/electrode and a CIGS inclusive semiconductor absorber. The interfacial seed layer may be of or include one or more element(s) that make up, or help make up, the CIGS inclusive semiconductor absorber. Various methods and compositions of the interfacial seed layer are disclosed, including a seed layer comprising metallic and/or substantially metallic Cu—In—Ga, CIGS, and/or a stack of alternating layers of or including Cu, In and Ga. Methods for making the back contact configuration, including an interfacial seed layer, are also provided.

26 Claims, 5 Drawing Sheets

(56) References Cited

U.S. PATENT DOCUMENTS

| | | |
|---|---|---|
| 2010/0300512 A1 | 12/2010 | Auvray et al. |
| 2011/0097841 A1 | 4/2011 | Krasnov et al. |
| 2011/0253219 A1* | 10/2011 | Gerbi .................... 136/264 |
| 2012/0174977 A1 | 7/2012 | Choi |

OTHER PUBLICATIONS

U.S. Appl. No. 13/455,300, filed Apr. 25, 2012; Krasnov.
"Electrochemical Codeposition of Indium and Gallium for Chalcopyrite Solar Cells", Zank et al., Thin Solid Films 286 (1996), pp. 259-263.
"Chalcopyrite Thin Film Solar Cells by Electrodeposition", Lincot et al., Solar Energy 77 (2004), pp. 725-737.
"Effect of a Thermal Oxydation Pre-Treatment on Mo to Control the Growth and Formation of $MoSe_2$ Layers for Use for CIGS Solar Cells"; Duchatelet et al., $25^{th}$ European Photovoltaic Solar Energy Conference and Exhibition, Sep. 6-10, 2010, pp. 3379-3381.
"A Comprehensive Characterization of the Interfaces in Mo/CIS/CdS/ZnO Solar Cell Structures"; Schmid et al., Solar Energy Materials and Solar Cells 41/42, (1996); pp. 281-294.
"Electrodeposition of Indium on Copper for CIS/CIGS Solar Cell Applications"; Huang et al., 2010 The Electrochemical Society (1 pg).
"Cu-Mo Contacts to $CuInSe_2$ for Improved Adhesion in Photovoltaic Devices"; Yang et al., Journal of Applied Physics, vol. 75, No. 2, Jan. 15, 1994, pp. 1185-1189.
International Search Report mailed Jun. 12, 2014.

\* cited by examiner

BACK ELECTRODE CONFIGURATION FOR ELECTROPLATED CIGS PHOTOVOLTAIC DEVICES AND METHODS OF MAKING SAME

CROSS-REFERENCE TO RELATED APPLICATIONS

This application is related to U.S. patent application Ser. Nos. 13/455,232, 13/455,282 and 13/455,300, filed concurrently herewith, the entire disclosures of which are incorporated by reference herein in their entireties.

TECHNICAL FIELD

This disclosure relates generally to photovoltaic devices (e.g., solar cells), a back contact or rear electrode (or contact) structure for use in photovoltaic devices such as solar cells, coated articles for use in photovoltaic devices such as solar cells, and methods of making the same. The disclosure more particularly relates to a molybdenum-containing back electrode configuration that includes an interface, or seed, layer comprising element(s) that make up a CIGS absorber of a CIGS based photovoltaic device (e.g., solar cell) to provide improved matching between the molybdenum containing rear contact and the CIGS inclusive semiconductor absorber film (a "film" can be one or more layers). A seed layer herein may be made up of one or more layers/sublayers. The back (or rear) electrode may also function as a rear reflector and/or optical coupler of reflected light in certain example instances. According to certain example embodiments disclosed herein, the seed layer may be configured to be compositionally graded, e.g., in the vicinity of the interface between the rear contact and a CIGS absorber of a solar cell, thereby providing improved matching of the semiconductor absorber to the molybdenum containing rear contact. The disclosure also relates to a method of making a solar cell or coated article for use in a solar cell that provides or uses a seed layer to improve matching of the semiconductor absorber to the rear electrode.

BACKGROUND AND SUMMARY OF EXAMPLE EMBODIMENTS

Many different types of photovoltaic devices are known in the art (e.g., see U.S. Patent Document Nos. 2004/0261841, 2006/0180200, U.S. Pat. Nos. 4,335,266, 4,611,091, 6,784,361, 6,288,325, 6,631,603, and 6,123,824, the disclosures of which are incorporated by reference herein in their entireties). Examples of known photovoltaic devices include copper-indium gallium diselenide (approximately $Cu(In, Ga)(Se,S)_2$ and/or $CuIn_{x-1}Ga_xSe_2$) solar cells, also known as CIGS solar cells. There are other example compositions of a semiconductor absorber layer of a solar cell that may also be referred to as "CIGS." These include, for example, and without limitation, copper-indium-gallium sulfide. CIGS films are conductive semiconductor compounds that are often referred to as an absorber or light absorbing layer(s) or film. Generally speaking, CIGS type photovoltaic devices include, from the front or light incident side moving rearwardly, a front cover of material such as glass (front substrate), a front electrode comprising a transparent conductive layer(s) (e.g., a transparent conductive oxide such as zinc oxide), a light absorption semiconductor film (e.g., CIGS), a rear electrode or contact, and a rear substrate of a material such as, for example, soda-lime-silica based glass (or metal foil for flexible applications). In some instances, an adhesive may be provided between the front cover glass (front substrate) and the front electrode. It is also the case in some instances that the device is provided with window layer(s) (e.g., of or including CdS, ZnS, or the like). Photovoltaic power is generated when light incident on the front side (or front cover glass) of the device passes through the front electrode and is absorbed by the light absorption semiconductor film (e.g., CIGS), as is known in the art. Certain designs may also utilize compositional grading of the semiconductor absorber, for example, with an increased Ga/(Ga+In) ratio toward the rear electrode or contact. Photovoltaic devices having a compositionally graded CIGS absorber may, for example, be made using a two- or three-step deposition process.

For example, with reference to FIG. 1, there is generally provided a schematic cross-sectional diagram illustrating various elements of a conventional CIGS-type photovoltaic device 10. The cell 10 is structurally supported on a glass substrate (or back glass) 12. A back contact of a metal layer, such as, for example, molybdenum (Mo) 14 is typically deposited on the glass substrate 12. The first active region of the device 10 comprises a semiconductor film 16 which is typically a p-type copper indium/gallium diselenide (CIGS). A thin "window" layer of n-type compound semiconductor 18, typically comprising cadmium sulfide (CdS), may then be formed on CIGS film 16. A layer of conducting wide bandgap semiconductor material 20, typically formed of a substantially transparent conductive metal oxide, such as zinc oxide, is deposited on the CdS layer 18 and acts as a transparent front contact/electrode 25 for the device 10. The device 10 may be completed by including a series of front face contacts (not shown) in the form of, for example, a metal grid on top of the transparent front contact 25 to facilitate the extraction of generated electrons, and a front glass substrate 21. A large solar cell may also be divided into a number or smaller cells by means of scribes, such as, for example, laser or mechanical scribes or the like, traditionally referred to as P1, P2 and P3, which allow individual cells to be connected in series.

As noted above, a metal such as Mo may be used as the rear electrode (or back contact) 14 of a photovoltaic device, such as, for example, a CIGS solar cell 10, to extract positive charges generated in the CIGS semiconductor absorber 16 of the solar cell 10. In certain instances, the Mo rear electrode 14 may be sputter-deposited using, for example, direct-current magnetron sputtering, onto the back glass substrate 12 of the CIGS solar cell 10. As noted above, the core of a CIGS cell may be a polycrystalline p-type chalcopyrite semiconductor absorber, traditionally formed, for example, using co-evaporation, sputtering, or non-vacuum solution processes, followed by a solid-vapor reaction with selenium or sulfur (in the case of copper-indium-gallium sulfide CIGS) at a high-temperature, sometimes referred to as selenization or sufurization.

Electroplating the CIGS absorber has recently emerged as a technique for inexpensively manufacturing CIGS devices. Some advantages of electroplating include high material utilization (e.g., reduced material waste), improved deposition precision and electroplating is a well known and well understood technique. In a typical electroplated CIGS device, a copper (Cu) seed layer in the range of 40-80 nm thick is used, and is typically deposited on a thick Mo rear contact layer 14. The CIGS absorber 16 is subsequently formed on the copper containing seed layer by high-temperature selenization and/or sulfurization. A thin (e.g., ~50-100 nm) n-type Cds window layer is formed on the CIGS absorber using chemical bath deposition, after which a TCO front contact/electrode 25 is formed. During device formation, an ordered defect chalcopyrite (ODC) is formed at the CIGS/CdS interface. This ODC is known to improve device performance.

Formation of the CIGS on the copper seed layer may be accomplished in any number of ways. Each of the CIGS deposition methods is followed by high-temperature post-deposition baking at temperatures between about 450° C.-600° C. A first example method includes electroplating an additional Cu layer followed by electroplating of In and Ga layers, and then subjecting the stack to a reaction with Se or S. A second example method includes electroplating of Cu—In, Cu—Ga, In—Ga or Cu—Se, Ga—Se and In—Se alloys and then reacting them on the Cu seed layer. A third example method includes simply electroplating the entire CIGS compound. However, the CIGS absorber 16 is poorly matched with the Mo rear contact 14, resulting in performance disadvantages.

Therefore, according to certain example embodiments of this invention, there is needed an interface (or "seed") layer interposed between the rear contact 14, typically substantially comprising Mo, and the CIGS absorber 16 in CIGS-type photovoltaic devices. According to certain example embodiments disclosed and described herein, the interfacial/seed layer interposed between the Mo rear contact 14 and the CIGS absorber 16 may comprise or consist essentially of element(s) that make up the CIGS absorber, such as, for example, one, two or three of Cu, In and Ga. The interfacial seed layer may be made up of one or more layers/sublayers.

In certain example embodiments of this invention, there is provided a method of making a photovoltaic device, the method comprising: forming a conductive back electrode layer comprising Mo on a rear substrate; sputter-depositing an interfacial seed layer on said rear substrate and on said conductive back electrode layer, said seed layer comprising copper, indium and gallium; forming a semiconductor absorber on the rear substrate over the interfacial seed layer, wherein said forming the semiconductor absorber comprises sputter-depositing a layer comprising or consisting essentially of Cu and thereafter electroplating a film comprising In and Ga over at least the layer comprising or consisting essentially of Cu, said film comprising In and Ga including one or more layers.

Additionally, it may be advantageous to provide an interfacial seed layer that is/are compositionally graded in the vicinity of the Mo/CIGS interface to further improve the matching of the semiconductor CIGS absorber 16 to the Mo rear electrode 14. Compositional grading of the resulting interfacial seed layer may be accomplished in various ways that are discussed in greater detail below with respect to various example embodiments.

According to certain example embodiments disclosed herein several different example seed layers are disclosed. Any of these seed layers may be used alone or in combination with each other, and optionally be provided above or on top of (directly or indirectly) the Mo portion 14 of the back contact. For example, a seed layer or stack comprising or consisting essentially of a plurality of sublayers or film(s) may be sputter deposited in a graded manner using multiple sputtering cathodes with precise and well controlled compositions of Cu, In and Ga in an alternating manner. It has been found that it is thus easier to control the composition, thickness and/or molar ratio of the Cu, In and Ga components of the example seed stack according to certain example embodiments by using sputtering as opposed to relying on a diffusion profile. According to certain example embodiments, a concentration of Ga may be incrementally decreased in a direction going away from the rear contact to provide a compositionally graded seed layer. According to certain example embodiments, a concentration of In may be incrementally increased in a direction going away from the rear contact.

According to certain other example embodiments, a plurality of metallic and/or substantially metallic Cu—Ga—In layers may be deposited above (directly or indirectly) the Mo rear contact 14 and between the CIGS 16 and Mo 14 at the CIGS/Mo interface. The Ga concentration may be incrementally decreased and/or the In content incrementally increased in subsequently sputtered layers to bring their concentration level(s) in the outermost layer of the seed stack close and/or proximate to those used in the bulk of the CIGS absorber 16 and to improve matching of the Mo rear contact 14 and CIGS absorber 16. Additionally, it may be preferred that the concentrations of Cu, In and Ga follow a relative concentrational relationship wherein, for example, $[Cu]>([In]+[Ga])$, where $[Cu]$ is a concentration of Cu, $[In]$ is a concentration of In, and $[Ga]$ is a concentration of Ga. In certain examples, a seed layer(s) adjacent the Mo rear contact 14 may have a Ga concentration higher than another seed layer(s) further away from the Mo rear contact 14. According to certain example embodiments, a concentration of Ga may be incrementally decreased in a direction going away from the rear contact 14. According to certain example embodiments, a concentration of In is incrementally increased in a direction going away from the rear contact 14.

According to certain example embodiments, a compositionally complete thin sputtered CIGS layer(s) may be used to form various layer(s) of the interfacial seed layer(s) for an electroplated absorber. According to such an example embodiment, a concentration of Ga in one, some or all of the compositionally complete CIGS layer(s) may be incrementally decreased in a direction going away from the rear contact 14. According to certain example embodiments, a concentration of In in one, some or all of the compositionally complete CIGS layer(s) may be incrementally increased in a direction going away from the rear contact 14.

According to certain example embodiments, the Mo electrode 14 may be slightly oxidized and/or provided with a thin MoOx layer at the CIGS/Mo interface to raise the Mo work function to better match it to the Ga-rich interface portion of the seed layer closest to the Mo rear contact.

In any example embodiment of this invention, a dielectric layer (e.g., of or including silicon nitride, silicon oxide, aluminum oxide, and/or silicon oxynitride) may be used between the Mo 14 and the back substrate 12, which may comprise soda-lime-silica based glass, to slow or reduce diffusion of elements from the glass to the precisely tailored seed layer(s) at the CIGS/Mo interface.

These and other embodiments and advantages are described herein with respect to certain example embodiments and with reference to the following drawings in which like reference numerals refer to like elements, and wherein:

DETAILED DESCRIPTION OF EXAMPLE EMBODIMENTS

Figure 1:
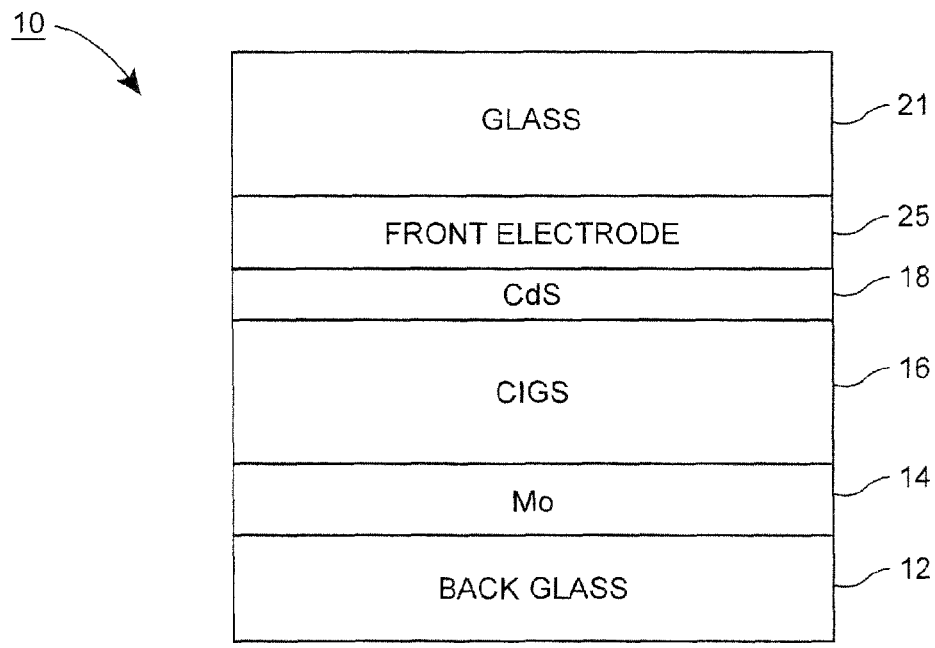
FIG. 1 is a cross sectional view of an example CIGS photovoltaic device.

Referring now more particularly to the figures in which like reference numerals refer to like elements in the several views, detailed descriptions of example embodiments are disclosed herein.

Photovoltaic devices such as solar cells convert solar (or other light) radiation into usable electrical energy. The energy conversion typically occurs as a result of the photovoltaic effect. Light radiation (such as, for example, sunlight) impinging on a photovoltaic device and absorbed by an active region of semiconductor material (e.g., a semiconductor film including one or more semiconductor layers, such as, for example, CIGS) 16, sometimes called an absorbing layer or film, generates electron-hole pairs in the active region. The electrons and holes may be separated by an electric field of a junction in the photovoltaic device. The separation of electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region (or vice versa) as impinging light energy continues to generate electron-hole pairs in the photovoltaic device.

Certain CIGS configurations may utilize compositional grading of the semiconductor absorber 16, for example, with an increased Ga/(Ga+In) ratio toward the rear electrode or contact. Photovoltaic devices having a compositionally graded CIGS absorber may, for example, be made using a two- or three-step deposition process. Moreover, it may sometimes be the case that the CIGS absorber is poorly matched with the substantially Mo rear contact, potentially resulting in performance disadvantages.

According to certain example embodiments, an interface "seed" layer 15 of one or more layers may be interposed between the rear contact 14, typically conductive metallic and/or substantially metallic Mo, and the CIGS absorber 16 in CIGS-type photovoltaic devices. Additionally, according to certain example embodiments disclosed and described herein, the interfacial or seed layer 15 interposed between the Mo rear contact 14 and the CIGS absorber 16 may comprise elements that make up the CIGS absorber, such as, for example, Cu, In and Ga. It may also be advantageous to provide an interfacial seed layer 15 that is compositionally graded in the vicinity of the Mo/CIGS interface to further improve the matching of the semiconductor CIGS absorber 16 to the Mo rear electrode 14. Compositional grading of the resulting interfacial seed layer 15 may be accomplished in various ways that are discussed in greater detail below with respect to various example embodiments.

Figure 2:
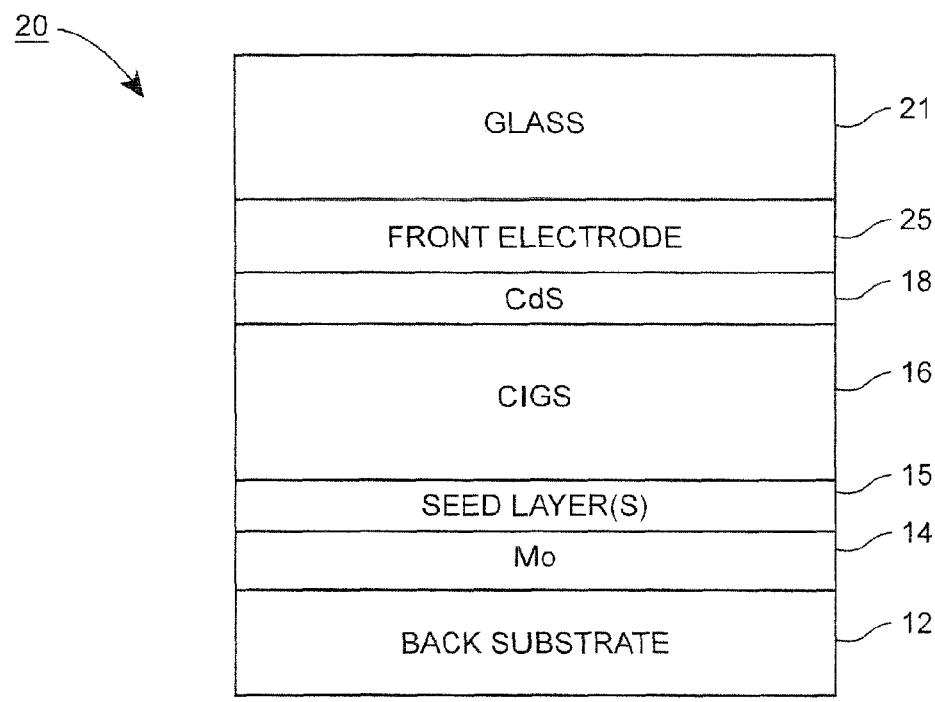
FIG. 2 is a cross sectional view of an example rear electrode configuration, including an example seed layer(s), of a photovoltaic device according to certain example embodiments disclosed herein.

With reference to FIG. 2, an example photovoltaic device 20, such as, for example, a CIGS solar cell, according to certain example embodiments is illustrated in relevant cross section. The photovoltaic device 20, includes a rear or back substrate 12 comprising, for example, soda-lime-silica based glass (or metal foil in certain flexible applications). The back substrate 12 supports a reflective rear electrode or contact 14 of or including metallic or substantially metallic Mo (of course it will be understood that Mo used in back contact configurations described herein may include certain amounts of other elements and/or dopants). According to certain preferred example embodiments discussed herein, a thickness of the Mo rear contact 14 may be in a range of from about 20-1000 nm, more preferably from about 300-900 nm, even more preferably from about 200-600 nm, and even more preferably about 600 or 400 nm. A seed layer 15 (which may include one or more layers), including or consisting essentially of elements that make up the CIGS absorber 16 (e.g., Cu, In, Ga and/or CIGS), may be provided on (directly or indirectly) or over the Mo based rear contact 14 and between the Mo based rear contact 14 and the CIGS absorber 16. Various example seed layer embodiments are discussed below with reference to the various figures. A semiconductor absorber 16, preferably comprising CIGS, is provided above (directly or indirectly) the seed layer 15. The seed layer 15 forms an interfacial layer(s) between the substantially Mo rear contact 14 and the CIGS absorber 16.

In any embodiment herein, after forming (e.g., by sputter-depositing) the seed layer 15 comprising Cu, In and Ga (which seed layer 15 includes one or more layers), formation of the CMS absorber film 16 on and over the seed layer 15 may be accomplished in any number of ways. A layer of or including copper (Cu), in the range of from about 20-100 nm thick, more preferably from about 40-80 nm thick, is sputter deposited on the rear substrate over the seed layer 15 and over the Mo based rear contact layer 14. Thereafter, electroplating may be utilized in any of a number of different ways in forming the CIGS based absorber. A first example method includes electroplating respective In and Ga layers over the sputter-deposited Cu layer, and then subjecting the stack to a reaction with Se or S. A second example method includes electroplating of Cu—In, Cu—Ga, In—Ga or Cu—Se, Ga—Se and In—Se alloys and then reacting them on the Cu layer. A third example method includes simply electroplating the entire CIGS compound. Each of these three examples for forming the CIGS is followed by high-temperature post-deposition baking at temperatures between about 450° C.-600° C. The seed layer 15 between the Mo based layer 14 and the Cu layer in electroplated CIGS embodiments pre-defines the Mo/CIGS interface and makes it less susceptible to inter-diffusion temperature related processes, and does not significantly compromise the cost advantage of electroplating. In certain example embodiments, the thin seed layer 15 and the Cu layer are sputter-deposited on the rear substrate over the Mo based rear electrode 14, and thereafter the rests of the CIGS is electroplated. The sputter-deposited Cu layer will eventually absorb the other metals electroplated on top of it during high-temperature selenization.

Thereafter, a window layer 18 of or including CdS (or optionally ZnS) may be provided on and over (directly or indirectly) the absorber 16. A front electrode 25 preferably comprising a transparent metal oxide, such as, for example, tin oxide, ZnO, and/or a bi-layer of ZnO and n-doped (with, for example, Al) ZnO:Al may also be provided. The device 20 may be completed by including a series of front face contacts (not shown) in the form of, for example, a metal grid on top of the transparent front electrode 25 to facilitate the extraction of generated electrons, and a front glass substrate 21. A large solar cell may also be divided into a number or smaller cells by means of scribes, such as, for example, laser or mechanical scribes or the like, traditionally referred to as P1, P2 and P3, which allow individual cells to be connected in series.

Figure 3:
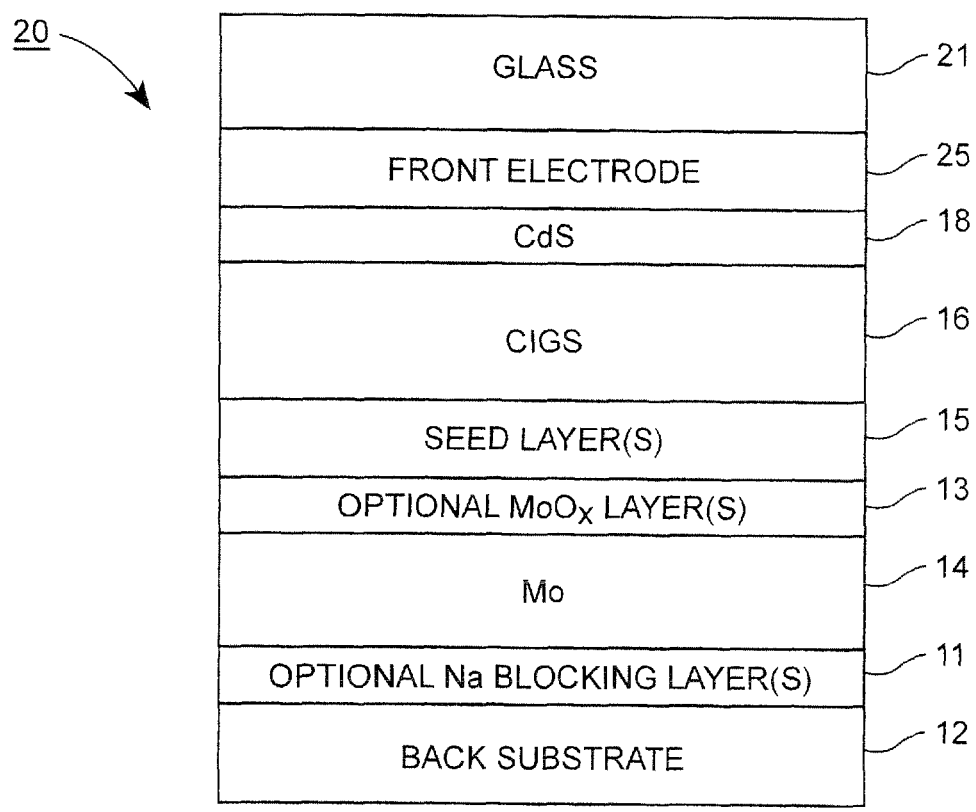
FIG. 3 is a cross sectional view of an example rear electrode configuration, including an example seed layer(s) and further including optional sodium blocking layer(s) and molybdenum oxide layer(s), of a photovoltaic device according to certain example embodiments disclosed herein.

Referring now to FIG. 3, according to certain example embodiments disclosed herein, the photovoltaic device 20, may further be provided with additional layer(s) and/or layer portion(s) to further improve performance of the device 20. For example, and without limitation, the device 20, may include an optional dielectric layer(s) 11 interposed between the back substrate 12 and the Mo rear contact 14. The optional sodium blocking dielectric layer(s) 11, may comprise, for example, and without limitation, silicon nitride, SiOxNy, SiOx, AlOx, and/or the like. The sodium blocking layer(s) 11 may be used between the Mo based rear contact 14 and a back substrate 12 which may comprise soda-lime-silica based glass, to slow or reduce the diffusion of elements from the glass to the precisely tailored seed layer 15 at the CIGS/Mo interface. For example, and without limitation, a thickness of the optional sodium blocking layer(s) 11 may preferably be in a range of from about 10-500 nm, and more preferably from about 20-200 nm, and for example about 100 nm thick. A layer and/or layer portion of oxidized Mo 13 may be provided at an outermost portion of the Mo rear contact 14 between the Mo rear contact 14 and the seed layer 15, to raise the Mo work function to better match the Mo based contact to the Ga-rich interface portion of the seed layer 15. The oxided Mo layer portion 13 may or may not be considered part of the Mo rear contact layer 14. For example, and without limitation, a thickness of the oxidized Mo layer or layer portion 13 may preferably be from about 5-200 nm, more preferably from about 10-100 nm, with an example thickness being about 50 nm.

Figure 4:
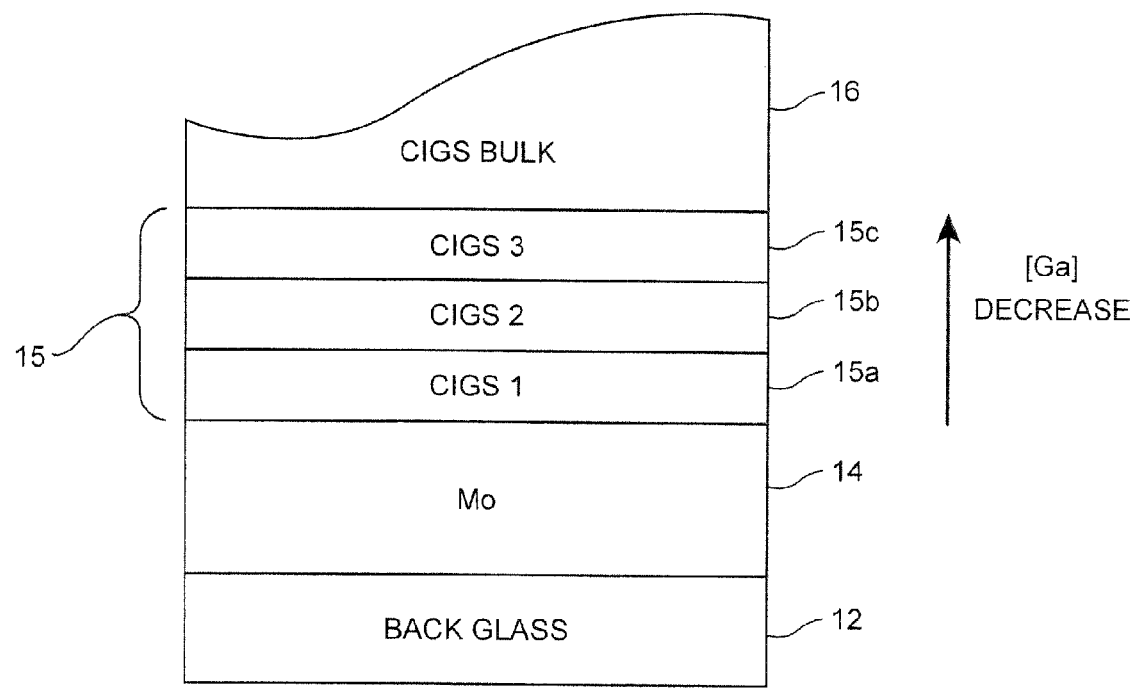
FIG. 4 is a cross sectional view of an example rear electrode configuration, including an example seed layer(s) comprising compositionally complete thin CIGS layers, of a photovoltaic device according to certain example embodiments disclosed herein.
Figure 5:
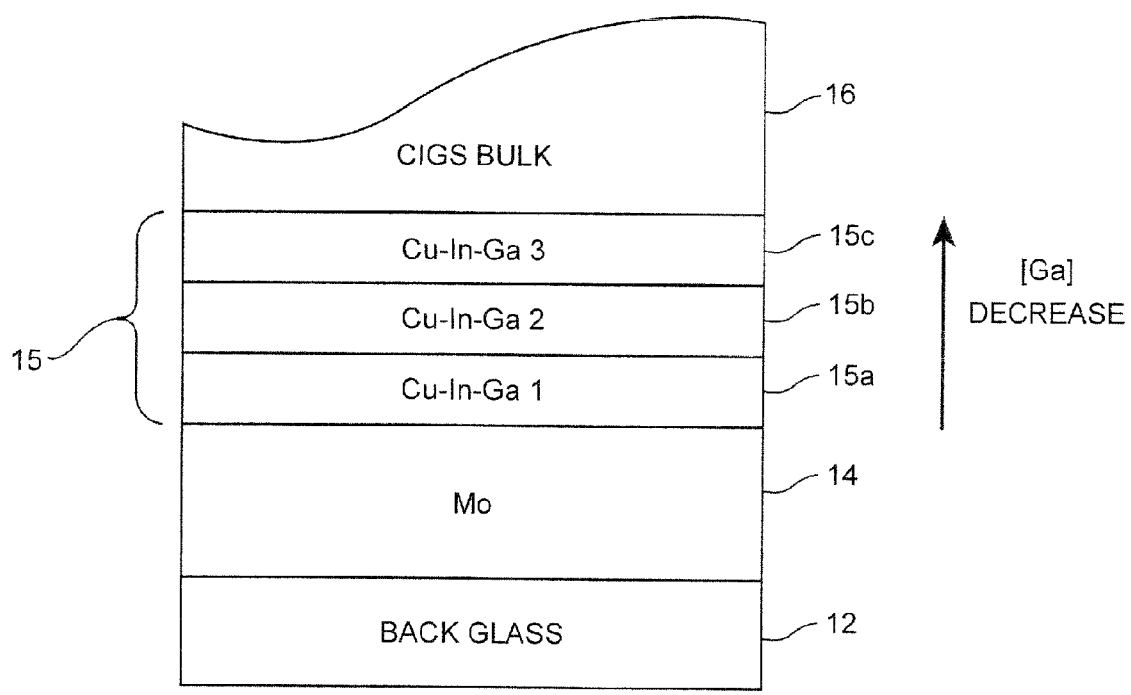
FIG. 5 is a cross sectional view of an example rear electrode configuration, including an example seed layer(s) comprising metal Cu—Ga—In layers, of a photovoltaic device according to certain example embodiments disclosed herein.

According to certain example embodiments disclosed herein several different example seed layers 15 are disclosed. Any of these seed layers may optionally be provided on and/or above (directly or indirectly) the Mo based rear contact 14. FIGS. 2-3 illustrate general embodiments of certain example embodiments of this invention, whereas FIGS. 4-6 illustrate details of various seed layers that may be used as the seed layer in FIG. 2 and/or FIG. 3.

Figure 6:
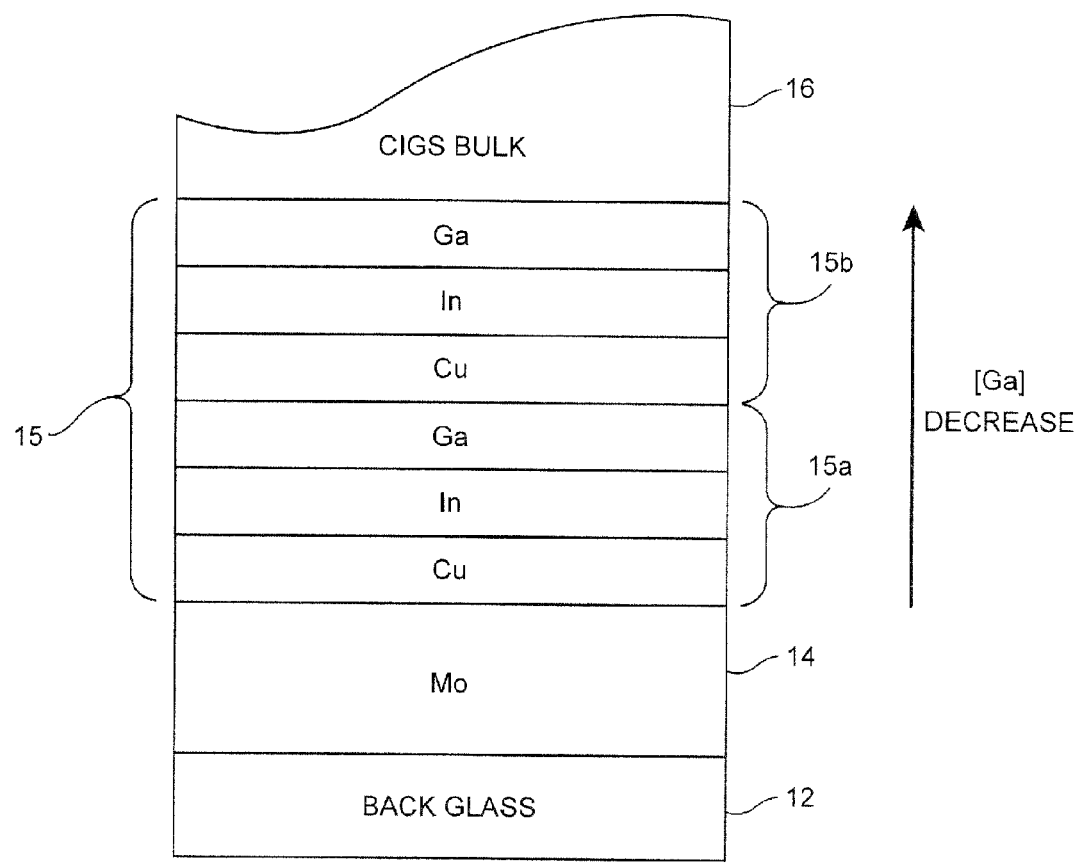
FIG. 6 is a cross sectional view of an example rear electrode configuration, including an example seed layer(s) comprising seed stacks comprising alternating layers of Cu, In and Ga, of a photovoltaic device according to certain example embodiments disclosed herein.

With reference to FIG. 6, for example, a seed layer 15 that may be used in connection with FIG. 2 and/or FIG. 3 includes a plurality of stacks 15a and 15b, each stack including multiple layers. The seed layer 5 may be sputter deposited in a graded manner using multiple cathodes with well controlled compositions of Cu, In and Ga in an alternating manner as shown in FIG. 6. It has been found that it is easier to control the composition, thickness and molar ratio of the Cu, In and Ga components of the example seed layer stack 15 according to certain example embodiments by using sputtering as opposed to relying on a diffusion profile. According to certain example embodiments, a concentration of Ga in the seed layer 15 may be incrementally decreased in a direction going away from the rear contact 14. According to still further example embodiments, a concentration of In in the seed layer 15 is incrementally increased in a direction going away from the rear contact 14.

With continuing reference to FIG. 6, an example seed layer 15 is illustrated. The seed layer 15 includes stacks 15a and 15b, each stack comprising alternating thin layers of Cu, In and Ga. Precise thicknesses and molar ratios of the various elements (e.g., Cu, In and Ga) of the seed layer stacks 15a and 15b according to this example embodiment may be achieved using sequential sputtering. The thickness ratios of the individual layers within the seed layer stacks 15a, 15b, are determined based on a desired ratio of elements in the interfacial seed layer 15 after high-temperature selenization that is subsequently used to form the CIGS absorber 16. Moreover, according to an example embodiment, it may be preferred that a concentration of the Ga in the stacks 15a, 15b decreased in a direction going away from the Mo based rear contact 14. Moreover, it may also preferably be the case that a concentration of In in the stacks 15a, 15b increases in a direction going away from the Mo rear contact 14.

According to certain other preferred example embodiments, a plurality of metallic and/or substantially metallic ("substantially metallic" includes "metallic") Cu—Ga—In layers 15a-15c, preferably at least two, may be deposited on (directly or indirectly) the Mo rear contact 14 and between the CIGS 16 and Mo 14 at the CIGS/Mo interface. Referring now to FIG. 5, the seed layer 15 may include a plurality of Cu-based substantially metallic Cu—In—Ga layers 15a, 15b, and 15c. According to a preferred example embodiment, the concentration of the seed layer 15 may be compositionally graded to provide improved performance. For example, a concentration of the various elements of each of the Cu—In—Ga layers 15a, 15b, 15c may, for example, have relative concentrations, wherein [Cu]>([In]+[Ga]) where [Cu] is a concentration of Cu, [In] is a concentration of In and [Ga] is a concentration of Ga. In certain examples, layer 15a closer to or adjacent the Mo rear contact 14 may have a Ga concentration higher than other layer(s) 15b, 15c that are located further away from the Mo rear contact 14. Additionally, according to certain example embodiments, the Ga concentration may be incrementally decreased and/or the In concentration may be incrementally increased in subsequently sputtered layers to bring their concentration levels in an outermost layer of the seed stack to be close to those used in the bulk of the CIGS absorber 16 and to improve matching of the Mo rear contact 14 and CIGS absorber 16. According to still further example embodiments, a concentration of In is incrementally increased in a direction going away from the rear contact. For example, and without limitation, a concentration ratio of [Ga]/([In]+[Ga]) may be graded, e.g., incrementally decrease from about 0.5 or 0.4 at an interface 15a to the Mo inclusive rear contact 14 to about 0.3 in the bulk of the CIGS absorber 16. As another example non-limiting alternative, the concentration ratio of [Ga]/([In]+[Ga]) may be held at about the 0.3 concentration ratio of the CIGS bulk 16 at an interface 15a to the substantially Mo rear contact 14. It will be understood that the concentration ratio described above may be in a range of about 0.9 to 0.3 in various example embodiments.

According to a further embodiment, as illustrated in FIG. 4, a compositionally complete thin sputtered CIGS layer 15 made up of layers 15a, 15b, and 15c may be used to form the interfacial seed layer 15 for an electroplated CIGS absorber type photovoltaic device in the general FIG. 2 and/or FIG. 3 embodiment. According to a preferred example embodiment, the concentration of the seed layer 15 in FIG. 4 may be compositionally graded to provide improved performance. Thus, for example, according to certain examples of this embodiment, concentration of Ga in each of the compositionally complete CIGS layers 15a, 15b, 15c may be incrementally decreased in a direction going away from the rear contact 14. Thus, the concentration of Ga in layer 15a is greater than the concentration of Ga in layer 15b, and the concentration of Ga in layer 15b is greater than the concentration of Ga in layer 15c. According to still further example embodiments, a concentration of In in each of the compositionally complete CIGS layers 15a, 15b, 15c may be incrementally increased in a direction going away from the rear contact 14. Thus, the concentration of In in layer 15a is less than the concentration of In in layer 15b, and the concentration of In in layer 15b is less than the concentration of In in layer 15c. For example, and without limitation, a concentration ratio of [Ga]/([In]+ [Ga]) may incrementally decrease, or be graded, from about 0.5 at an interface 15a with the Mo based rear contact to about 0.3 in the bulk of the CIGS absorber 16. Alternatively, the concentration ratio of [Ga]/([In]+[Ga]) may be graded or incrementally decrease from about 0.4 at an interface 15a with the Mo based rear contact to about 0.3 in the bulk of the CIGS absorber 16. As another example, non-limiting alternative, the concentration ratio of [Ga]/([In]+[Ga]) may be held at about the 0.3 concentration ratio of the CIGS bulk 16 throughout the seed layer 15. It will be understood that the concentration ratio described above may be in a range of about 0.9 to 0.3 in various example embodiments.

It is also noted that a combined thickness (e.g., the sum thickness of layers 15a-15c in FIG. 4 or FIG. 5; or the thickness of layer 15 in FIG. 2, FIG. 3 or FIG. 6) of seed layer 15 according to any of the foregoing example embodiments, may preferably be in a range of from about 20-100 nm, or more preferably from about 40-80 nm, and may, for example, be about 60 nm thick. "About" as used herein means plus/minus 5%.

Figure 7:
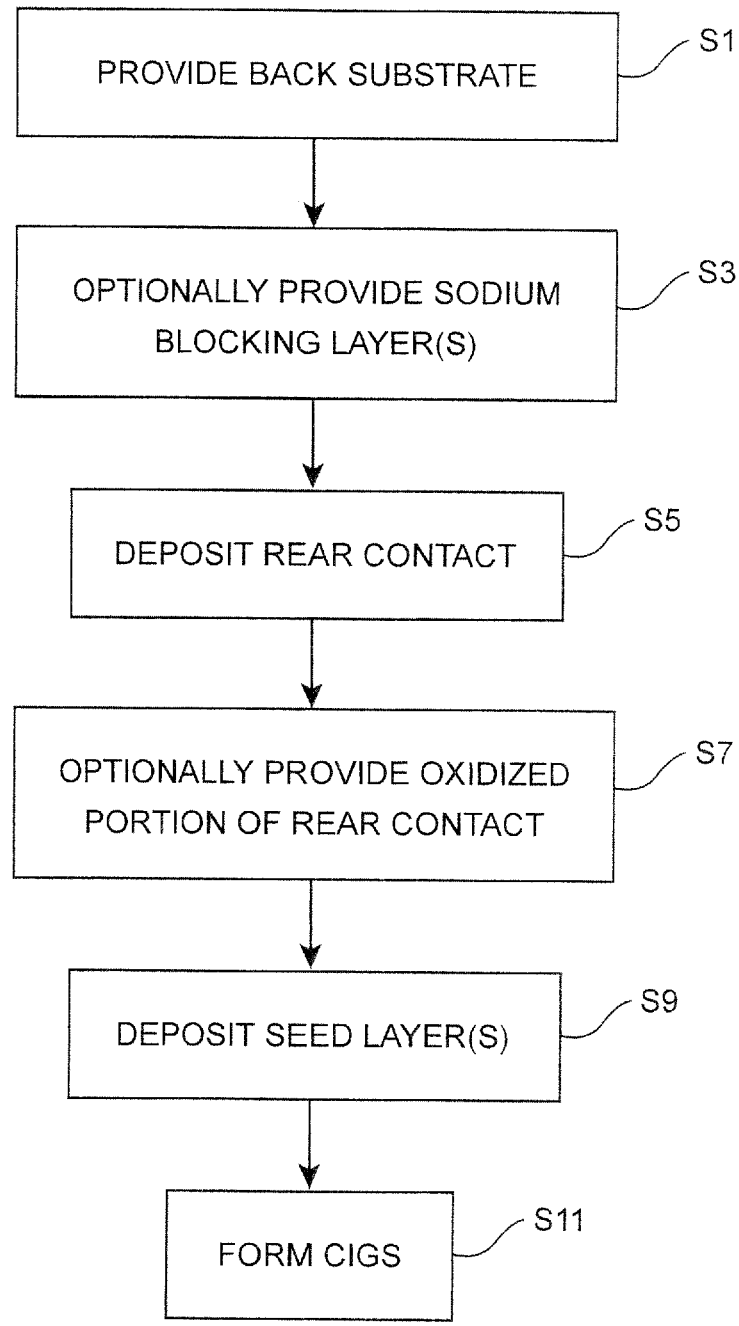
FIG. 7 is a flowchart illustrating a method of making a coated article for use in a photovoltaic device, such as, for example, a solar cell, according to certain example embodiments disclosed herein in which interfacial seed layer(s) may be used to provide matching of the Mo rear contact to the CIGS absorber at the Mo/CIGS interface.

With reference to FIG. 7, an example method of making a coated article for use in a photovoltaic device according to several example embodiments disclosed herein is shown in flowchart form. It is noted that this general method for making a coated article applies equally to the several alternative example embodiments disclosed herein. As shown in FIG. 7, a back substrate, such as for example, soda-lime-silica based glass 12 is provided in step S1. A sodium blocking dielectric layer 11 may also be optionally provided S3. The sodium blocking layer 11 may be of or include, for example, and without limitation SiOxNy, SiOx, AlOx, or the like. The sodium blocking layer(s) 11 may be provided between the Mo inclusive rear contact 14 and back substrate 12 which may comprise soda-lime-silica based glass, to slow or reduce the diffusion of Na from the glass 12 to the seed layer 15 at the CIGS/Mo interface. For example, and without limitation, a thickness of the optional sodium blocking layer(s) dielectric 11 may preferably be in a range of from about 10-500 nm, and more preferably in a range of about 20-200 nm, and may further preferably be about 100 nm thick.

With continuing reference to FIG. 7, a rear contact of or including metallic and/or substantially metallic Mo 14 may be deposited on (directly or indirectly) and over the rear substrate 12. For example, and without limitation, the rear contact 14, may be deposited S5 by direct-current magnetron sputtering using a single or multiple substantially Mo targets in an argon based atmosphere. According to a preferred example, Mo may be sputter deposited in a single run from a single Mo target. According to a still further example embodiment, Mo may be sputter deposited using multiple Mo targets. According to example embodiments, a thickness of the Mo inclusive rear contact 14 may be in a range of from about 20-100 nm, more preferably from about 300-900 nm, even more preferably from about 200-600 nm, and with example thicknesses being about 600 or about 400 nm. After deposition of the Mo rear electrode 14 (S5), an optional layer of or including oxidized Mo 13 may be provided at an outermost portion of the Mo layer 14 (S7). According to certain example embodiments, a portion of the Mo rear electrode may be oxidized S7 by exposing the rear contact 14 to an oxygen atmosphere, and/or by sputter depositing a thin layer of Mo in an argon and oxygen atmosphere S7. Depositing a thin layer or layer portion of oxidized Mo 13 increases the work function of the Mo based rear contact 14 to provide, for example, better matching of the Mo based rear electrode 14 to the CIGS absorber 16.

With continuing reference to FIG. 7, after deposition of the substantially Mo rear contact 14 (S5), seed layer 15 according to the various embodiments discussed above may be deposited S9. Numerous methods for depositing the various example seed layers discussed above may be used. For example, and without limitation, in embodiments in which the seed layer 15 is provided by depositing layers of substantially metallic Cu—In—Ga in a compositionally graded manner, in a preferred example, these layers may be sputter deposited using multiple cathodes to more precisely control the thickness of the sublayers that make up the seed layer 15. In example embodiments in which the seed layer 15 include seed stacks of alternating Cu, In and Ga, it may be preferred, for example, to deposit the seed stacks by sequential sputter deposition of the three metallic or substantially metallic sublayers with thickness control to achieve the desired thickness ratios that determine the desired ratio of elements in the final seed layer 15 after high-temperature selenization used in the CIGS formation process.

Referring still to FIG. 7, the CIGS absorber 16 is formed over or above (directly or indirectly) the seed layer 15 in step S11. Various methods for forming the CIGS absorber are disclosed in detail in related applications, such as, for example, U.S. patent application Ser. Nos. 13/455,232, 13/455,282 and 13/455,300, filed concurrently herewith, the disclosures of which are incorporated by reference herein in their entireties.

In certain example embodiments of this invention (e.g., FIGS. 2-7), there is provided a back contact structure for use in a photovoltaic device, comprising: a substrate; a conductive back contact layer comprising Mo; and an interfacial seed layer on (directly or indirectly) said substrate and on (directly or indirectly) said conductive back contact layer, said seed layer being compositionally graded (continuously or noncontinuously) and comprising at least one of: copper, indium and gallium; and wherein the conductive back contact layer is located between the substrate and the interfacial seed layer.

In the back contact structure of the immediately preceding paragraph, the substrate may comprise glass.

In the back contact structure of any of the preceding two paragraphs, said interfacial seed layer may comprise a plurality of substantially metallic and/or metallic layers comprising Cu, In, and Ga.

In the back contact structure of the immediately preceding paragraph, a first layer of said plurality of substantially metallic and/or metallic layers comprising Cu, In, and Ga may have a Ga content greater than that of a second layer of said plurality of substantially metallic and/or metallic layers comprising Cu, In, and Ga, wherein said second layer of said plurality of substantially metallic and/or metallic layers comprising Cu, In, and Ga is located farther from said conductive back contact layer comprising Mo than is said first layer of said plurality of substantially metallic and/or metallic layers comprising Cu, In, and Ga.

In the back contact structure of any of the preceding four paragraphs, said interfacial seed layer may comprise first and second metallic and/or substantially metallic layers comprising Cu, In and Ga, wherein said first layer is closer to said conductive back contact layer comprising Mo than is said second layer. The Ga content of said first layer may be greater than Ga content of said second layer.

In the back contact structure of any of the preceding two paragraphs, concentration may be characterized as [Cu]>([In]±[Ga]), where [Cu] is a concentration of Cu, [In] is a concentration of In, and [Ga] is a concentration of Ga.

In the back contact structure of any of the preceding three paragraphs, a concentration ratio of [Ga]/([In]+[Ga]) may decrease from about 0.5 (more preferably from about 0.4) at said first layer of said interfacial seed layer at an interface closest to said conductive layer comprising Mo to about 0.3 at an interface to be between said interfacial seed layer and a semiconductor absorber comprising CIGS of the photovoltaic device; or alternatively a concentration ratio of [Ga]/([In]+[Ga]) may be about 0.3 throughout said interfacial seed layer.

In certain example embodiments, said interfacial seed layer may comprise a plurality of copper based layers containing copper, indium and gallium, wherein a content of gallium in said plurality of copper based layers decreases in a direction away from said conductive back contact layer comprising Mo; and/or said interfacial seed layer may comprise a plurality of copper based layers containing copper, indium and gallium, and wherein a content of indium in said plurality of copper based layers increases in a direction away from said conductive back contact layer comprising Mo.

In certain example embodiments, said interfacial seed layer may comprise a plurality of layers comprising CIGS, where the overall seed layer may be compositionally graded. A concentration ratio of [Ga]/([In]+[Ga]) in said interfacial seed layer may be graded from about 0.5 (more preferably from about 0.4) at an interface closest to the conductive back contact layer comprising Mo to about 0.3 at an interface to be adjacent a semiconductor absorber of the photovoltaic device comprising CIGS; or a concentration ratio of [Ga]/([In]+[Ga]) may be about 0.3 throughout said interfacial seed layer.

In certain example embodiments, said interfacial seed layer may comprise a stack including a layer comprising or consisting essentially of Cu, a layer comprising or consisting essentially of In, and a layer comprising or consisting essentially of Ga. One or multiple such stacks may be provided. The layer comprising In may be located between and contacting each of the layer comprising Cu and the layer comprising Ga in the stack(s).

In the back contact structure of any of the preceding ten paragraphs, a thickness of the conductive back contact layer comprising Mo may be from about 200-1000 nm, more preferably from about 200-600 nm.

In the back contact structure of any of the preceding eleven paragraphs, a dielectric layer comprising silicon nitride and/or silicon oxynitride may be provided on the substrate that is located between at least the substrate and the conductive back contact layer comprising Mo. The dielectric layer may have a thickness of from about 20-200 nm.

In the back contact structure of any of the preceding twelve paragraphs, an oxide of Mo may be located between said back contact layer comprising Mo and said interfacial seed layer, and/or said back contact layer comprising Mo may include an area comprising oxidized Mo in a portion of said back contact layer farthest from the substrate. A thickness of said area comprising oxidized Mo may be from about 10-100 nm.

In the back contact structure of any of the preceding thirteen paragraphs, said back contact layer may consist essentially of Mo.

A photovoltaic device may comprising the back contract structure of any of the preceding fourteen paragraphs, and may further include a semiconductor absorber film comprising CIGS and a front electrode, wherein the absorber film comprising CIGS is located between at least the front electrode and the back contact structure.

In certain embodiments of this invention, there is provided a method of making a photovoltaic device, the method comprising: forming a conductive back contact layer comprising Mo on a rear substrate; sputter-depositing an interfacial seed layer on said rear substrate and on said conductive back contact layer, said interfacial seed layer comprising copper, indium and gallium; forming a semiconductor absorber film on the rear substrate over the interfacial seed layer, wherein said forming the semiconductor absorber film comprises sputter-depositing a layer comprising or consisting essentially of Cu and thereafter electroplating a film comprising In and Ga over at least the layer comprising or consisting essentially of Cu, said film comprising In and Ga including one or more layers.

The method of the immediately preceding paragraph may also include forming a front electrode over at least the semiconductor absorber film.

In the method of any of the preceding two paragraphs, said layer comprising or consisting essentially of Cu may be from about 20-100 nm thick.

In the method of any of the preceding three paragraphs, said layer comprising or consisting essentially of Cu may be from about 40-80 nm thick.

In the method of any of the preceding four paragraphs, said electroplating the film comprising In and Ga may include one or more of: (a) electroplating a layer comprising or consisting essentially of In and thereafter electroplating a layer comprising or consisting essentially of Ga, over the layer comprising or consisting essentially of Cu; (b) electroplating an entire compound comprising CIGS over the layer comprising or consisting essentially of Cu; and/or (c) electroplating of Cu—In, Cu—Ga, and In—Ga alloys, and reacting the alloys on the layer comprising or consisting essentially of Cu.

In the method of any of the preceding five paragraphs, said forming the semiconductor absorber film may comprise, after said electroplating, heating the electroplated layer(s) using at least temperature from about 450-600 degrees C.

In the method of any of the preceding six paragraphs, said interfacial seed layer, which includes one or more layers, may be from about 20-100 nm thick, more preferably from about 40-80 nm thick, with an example overall thickness being about 60 nm.

In the method of any of the preceding seven paragraphs, the rear substrate may comprise glass.

In the method of any of the preceding eight paragraphs, said interfacial seed layer may comprise a plurality of substantially metallic and/or metallic layers comprising Cu, In, and Ga. In certain example instances, (a) a first layer of said plurality of substantially metallic and/or metallic layers comprising Cu, In, and Ga has a Ga content greater than that of a second layer of said plurality of substantially metallic and/or metallic layers comprising Cu, In, and Ga, wherein said second layer of said plurality of substantially metallic and/or metallic layers comprising Cu, In, and Ga is located farther from said conductive back contact layer comprising Mo than is said first layer of said plurality of substantially metallic and/or metallic layers comprising Cu, In, and Ga; and/or (b) Ga content of said first layer is greater than Ga content of said second layer. In certain instances, a concentration ratio of [Ga]/([In]+[Ga]) decreases from about 0.5 (or from about 0.4) at said first layer of said interfacial seed layer at an interface closest to said conductive layer comprising Mo to about 0.3 at an interface to be between said interfacial seed layer and a semiconductor absorber comprising CIGS of the photovoltaic device; or alternatively a concentration ratio of [Ga]/([In]+[Ga]) may be about 0.3 throughout said interfacial seed layer.

In the method of any of the preceding nine paragraphs, said interfacial seed layer may comprise a plurality of copper based layers containing copper, indium and gallium, wherein a content of gallium in said plurality of copper based layers decreases in a direction away from said conductive back contact layer comprising Mo; and/or a content of indium in said plurality of copper based layers increases in a direction away from said conductive back contact layer comprising Mo.

In the method of any of the preceding ten paragraphs, said interfacial seed layer may comprise a plurality of layers each comprising CIGS which may or may not be compositionally graded. In certain example instances, a concentration ratio of [Ga]/([In]+[Ga]) in such an interfacial seed layer is graded from about 0.5 (or from about 0.4) at an interface closest to the conductive back contact layer comprising Mo to about 0.3 at an interface to be adjacent a semiconductor absorber of the photovoltaic device comprising CIGS.

In the method of any of the preceding eleven paragraphs, said interfacial seed layer may comprise a layer comprising or consisting essentially of Cu, a layer comprising or consisting essentially of In, and a layer comprising or consisting essentially of Ga. Said In layer may be located between and contacting each of the Cu and Ga layers.

In the method of any of the preceding twelve paragraphs, a thickness of the conductive back contact layer comprising Mo may be from about 200-1000 nm.

In the method of any of the preceding thirteen paragraphs, the method may further include sputter-depositing a dielectric layer comprising silicon nitride and/or silicon oxynitride on the substrate, the dielectric layer located between at least the substrate and the conductive back contact layer comprising Mo.

In the method of any of the preceding fourteen paragraphs, the method may include forming an oxide of Mo located between said back contact layer comprising Mo and said interfacial seed layer; and/or said back contact layer comprising Mo including an area comprising oxidized Mo in a portion of said back contact layer farthest from the rear substrate.

While certain example aspects of a coated article for use in photovoltaic devices and methods for making the same are described and discussed with respect to various example embodiments herein, it is to be understood that these example embodiments are meant to illustrative, not limiting. One skilled in the art would understand that various modifications may be made without departing from the true spirit and full scope of the following claims.

What is claimed is:

1. A method of making a photovoltaic device, the method comprising:
    forming a conductive back contact layer comprising Mo on a rear substrate;
    sputter-depositing an interfacial seed layer on said rear substrate and on said conductive back contact layer, said interfacial seed layer comprising copper, indium and gallium;
    forming a semiconductor absorber film on the rear substrate over the interfacial seed layer, wherein said forming the semiconductor absorber film comprises sputter-depositing a layer comprising or consisting essentially of Cu and thereafter electroplating a film comprising In and Ga over at least the layer comprising or consisting essentially of Cu, said film comprising In and Ga including one or more layers; and
    wherein said interfacial seed layer comprises a plurality of layers each comprising CIGS, and wherein said interfacial seed layer is compositionally graded.

2. The method of claim 1, further comprising forming a front electrode over at least the semiconductor absorber film.

3. The method of claim 1, wherein said layer comprising or consisting essentially of Cu is from about 20-100 nm thick.

4. The method of claim 1, wherein said layer comprising or consisting essentially of Cu is from about 40-80 nm thick.

5. The method of claim 1, wherein said electroplating the film comprising In and Ga includes electroplating a layer comprising or consisting essentially of In and thereafter electroplating a layer comprising or consisting essentially of Ga, over the layer comprising or consisting essentially of Cu.

6. The method of claim 1, wherein said electroplating the film comprising In and Ga includes electroplating an entire compound comprising CIGS over the layer comprising or consisting essentially of Cu.

7. The method of claim 1, wherein said electroplating the film comprising In and Ga includes electroplating of Cu—In, Cu—Ga, and In—Ga alloys, and reacting the alloys on the layer comprising or consisting essentially of Cu.

8. The method of claim 1, wherein said forming the semiconductor absorber film comprises, after said electroplating, heating the electroplated layer(s) using at least temperature from about 450-600 degrees C.

9. The method of claim 1, wherein said interfacial seed layer, which includes the plurality of layers, is from about 20-100 nm thick.

10. The method of claim 9, wherein said interfacial seed layer is from about 40-80 nm thick.

11. The method of claim 1, wherein the rear substrate comprises glass.

12. The method of claim 1, wherein said plurality of layers comprising CIGS of the interfacial seed layer are substantially metallic and/or metallic layers.

13. A method of making a photovoltaic device, the method comprising:
    forming a conductive back contact layer comprising Mo on a rear substrate;
    sputter-depositing an interfacial seed layer on said rear substrate and on said conductive back contact layer, said interfacial seed later comprising copper, indium and gallium;
    forming a semiconductor absorber film on the rear substrate over the interfacial seed layer, wherein said forming the semiconductor absorber film comprises sputter-depositing a layer comprising or consisting essentially of Cu and thereafter electroplating a film comprising In and Ga over at least the layer comprising or consisting essentially of Cu, said film comprising In and Ga including one or more layers;
    wherein said interfacial seed layer comprises a plurality of substantially metallic and/or metallic layers comprising Cu, In, and Ga, and wherein a first layer of said plurality of substantially metallic and/or metallic layers comprising Cu, In, and Ga has a Ga content greater than that of a second layer of said plurality of substantially metallic and/or metallic layers comprising Cu, In, and Ga, wherein said second layer of said plurality of substantially metallic and/or metallic layers comprising Cu, In, and Ga is located farther from said conductive back contact layer comprising Mo than is said first layer of said plurality of substantially metallic and/or metallic layers comprising Cu, In, and Ga.

14. A method of making a photovoltaic device, the method comprising:

forming a conductive back contact layer comprising Mo on a rear substrate;

sputter-depositing an interfacial seed layer on said rear substrate and on said conductive back contact layer said interfacial seed layer comprising copper, indium and gallium;

forming a semiconductor absorber film on the rear substrate over the interfacial seed layer, wherein said forming the semiconductor absorber film comprises sputter-depositing a layer comprising or consisting essentially of Cu and thereafter electroplating a film comprising In and Ga over at least the layer comprising or consisting essentially of Cu, said film comprising In and Ga including one or more layers;

wherein said interfacial seed layer comprises first and second metallic and/or substantially metallic layers comprising Cu, In and Ga, wherein said first layer is closer to said conductive back contact layer comprising Mo than is said second layer, and wherein Ga content of said first layer is greater than Ga content of said second layer.

15. The method of claim 14, wherein [Cu]>([In]+[Ga]) in the interfacial seed layer, where [Cu] is a concentration of Cu, [In] is a concentration of In, and [Ga] is a concentration of Ga.

16. The method of claim 14, wherein a concentration ratio of [Ga]/([In]+[Ga]) decreases from about 0.5 at said first layer of said interfacial seed layer at an interface closest to said conductive back contact layer comprising Mo to about 0.3 at an interface to be between said interfacial seed layer and a semiconductor absorber comprising CIGS of the photovoltaic device.

17. The method of claim 14, wherein a concentration ratio of [Ga]/([In]+[Ga]) decreases incrementally from about 0.4 at said first layer of said interfacial seed layer at an interface closest to said conductive back contact layer comprising Mo to about 0.3 at an interface to be between said interfacial seed layer and a semiconductor absorber comprising CIGS of the photovoltaic device.

18. The method of claim 14, wherein a concentration ratio of [Ga]/([In]+[Ga]) is about 0.3 throughout said interfacial seed layer.

19. A method of making a photovoltaic device, the method comprising:

forming a conductive back contact layer comprising Mo on a rear substrate;

sputter-depositing an interfacial seed layer on said rear substrate and on said conductive back contact layer, said interfacial seed layer comprising copper, indium and gallium;

forming a semiconductor absorber film on the rear substrate over the interfacial seed layer, wherein said forming the semiconductor absorber film comprises sputter-depositing a layer comprising or consisting essentially of Cu and thereafter electroplating a film comprising In and Ga over at least the layer comprising or consisting essentially of Cu, said film comprising In and Ga including one or more layers;

wherein said interfacial seed layer comprises a plurality of copper based layers containing copper, indium and gallium, wherein a content of gallium in said plurality of copper based layers decreases in a direction away from said conductive back contact layer comprising Mo.

20. A method of making a photovoltaic device, the method comprising:

forming a conductive back contact layer comprising Mo on a rear substrate;

sputter-depositing an interfacial seed layer on said rear substrate and on said conductive back contact layer, said interfacial seed layer comprising copper, indium and gallium;

forming a semiconductor absorber film on the rear substrate over the interfacial seed layer, wherein said forming the semiconductor absorber film comprises sputter-depositing a layer comprising or consisting essentially of Cu and thereafter electroplating a film comprising In and Ga over at least the layer comprising or consisting essentially of Cu, said film comprising In and Ga including one or more layers;

wherein said interfacial seed layer comprises a plurality of copper based layers containing copper, indium and gallium, and wherein a content of indium in said plurality of copper based layers increases in a direction away from said conductive back contact layer comprising Mo.

21. The method of claim 1, wherein a concentration ratio of [Ga]/([In]+[Ga]) in said interfacial seed layer is graded from about 0.5 at an interface closest to the conductive back contact layer comprising Mo to about 0.3 at an interface to be adjacent a semiconductor absorber of the photovoltaic device comprising CIGS.

22. The method of claim 1, wherein a thickness of the conductive back contact layer comprising Mo is from about 200-1000 nm.

23. The method of claim 1, further comprising sputter-depositing a dielectric layer comprising silicon nitride and/or silicon oxynitride on the substrate, the dielectric layer located between at least the substrate and the conductive back contact layer comprising Mo.

24. The method of claim 1, further comprising forming an oxide of Mo located between said back contact layer comprising Mo and said interfacial seed layer.

25. The method of claim 1, wherein said back contact layer comprising Mo includes an area comprising oxidized Mo in a portion of said back contact layer farthest from the rear substrate.

26. The method of claim 1, wherein said conductive back contact layer consists essentially of Mo.

* * * * *